United States Patent
Soeda

(10) Patent No.: US 6,822,279 B2
(45) Date of Patent: Nov. 23, 2004

(54) SEMICONDUCTOR DEVICE AND METHOD OF FABRICATING THE SAME

(75) Inventor: Shinya Soeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 21 days.

(21) Appl. No.: 10/077,767

(22) Filed: Feb. 20, 2002

(65) Prior Publication Data

US 2003/0052352 A1 Mar. 20, 2003

(30) Foreign Application Priority Data

Sep. 6, 2001 (JP) ........................................ 2001-270720

(51) Int. Cl.⁷ ............................................ H01L 27/108
(52) U.S. Cl. ..................... 257/296; 257/659; 257/306; 257/536; 257/758
(58) Field of Search ................................ 257/659, 296, 257/306, 536, 758

(56) References Cited

U.S. PATENT DOCUMENTS 3,373,323 A * 3/1968 Wolfrum et al. ............ 257/659
4,377,819 A * 3/1983 Sakai et al. ................. 257/659
5,686,746 A   11/1997 Iwasa

FOREIGN PATENT DOCUMENTS

JP          8-78640        3/1996

* cited by examiner

Primary Examiner—Mark V. Prenty
(74) Attorney, Agent, or Firm—Leydig, Voit & Mayer, Ltd.

(57) ABSTRACT

A semiconductor device has a semiconductor substrate and a resistor group and/or a signal interconnection layer in a region of the semiconductor substrate. A shielding layer is located above and/or below the region where the resistor group and/or the signal interconnection layer are located.

18 Claims, 14 Drawing Sheets

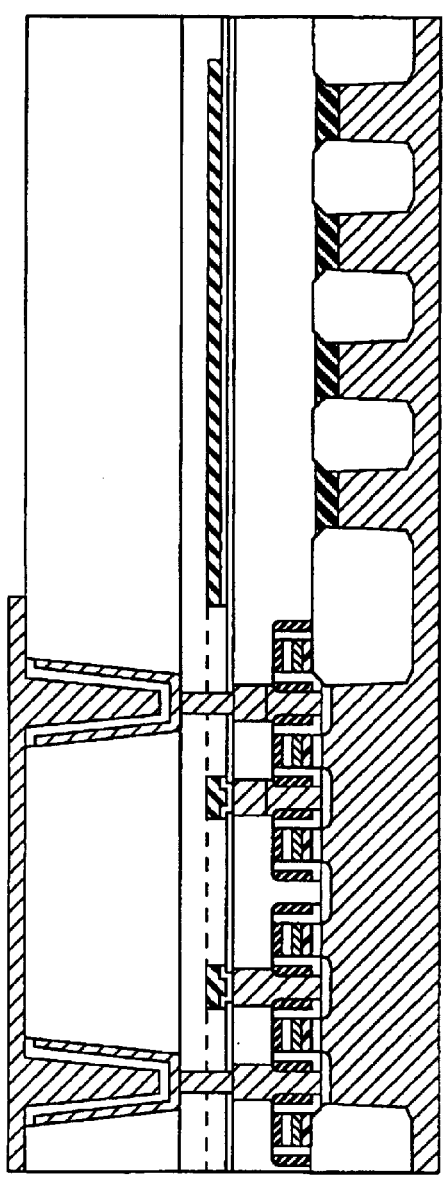
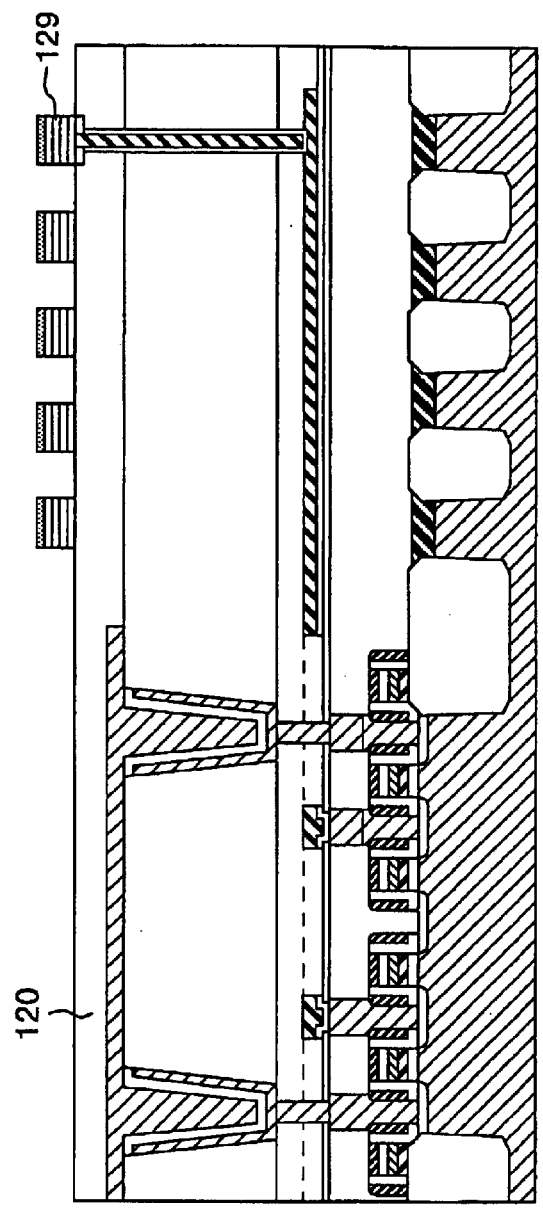
FIG.5A
FIG.5B

A — A'
DRAM REGION E1
LOGIC REGION E2

DRAM — LOGIC
201
202

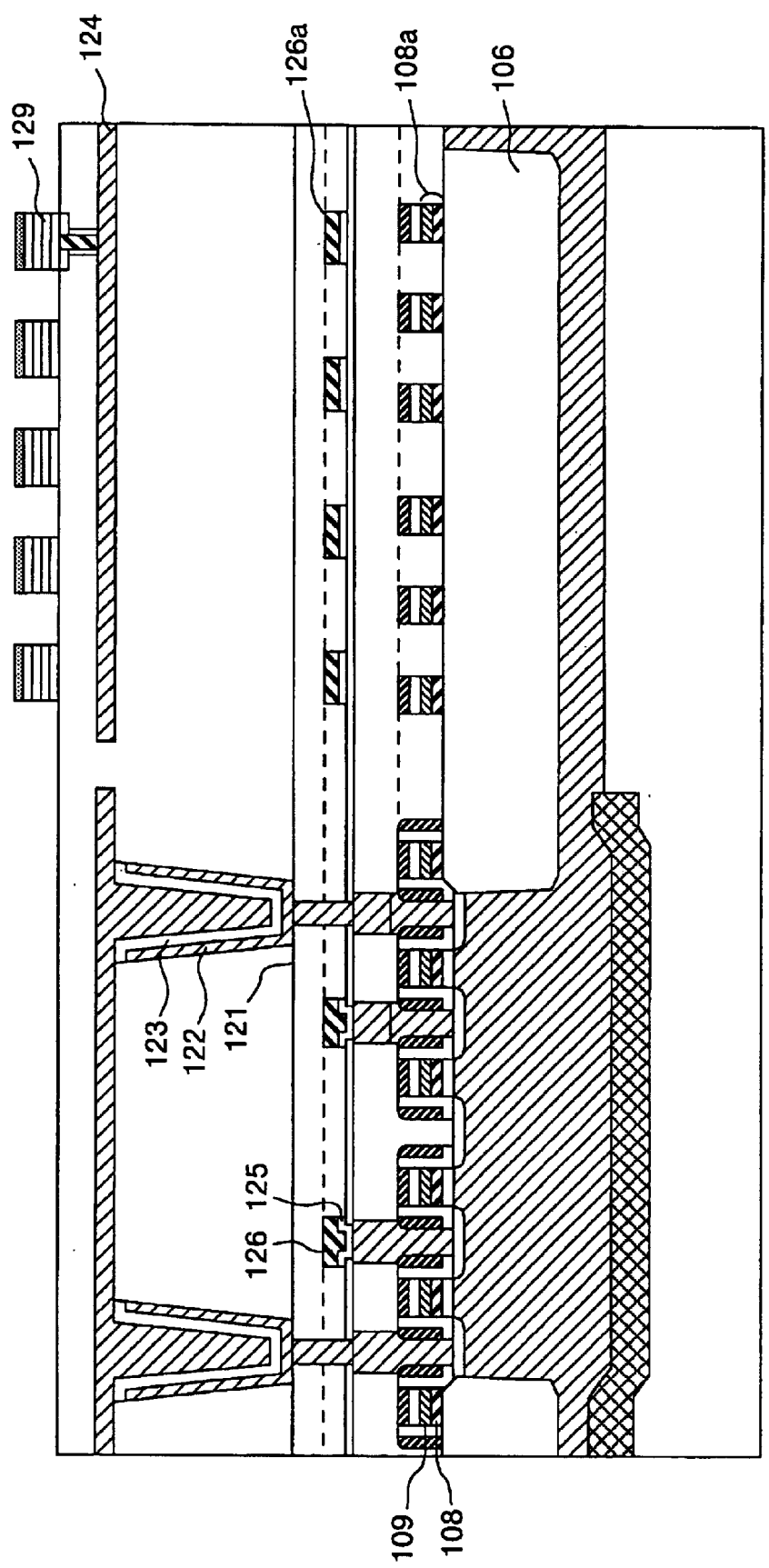

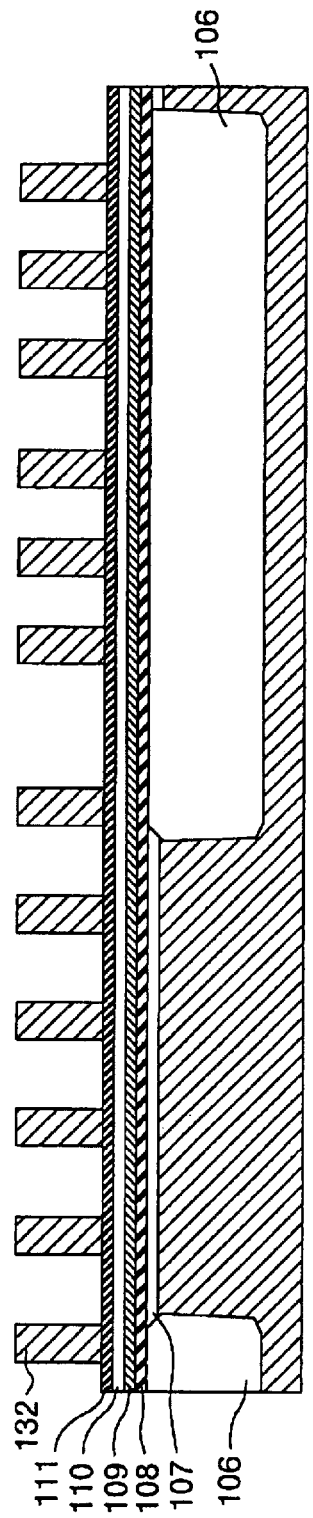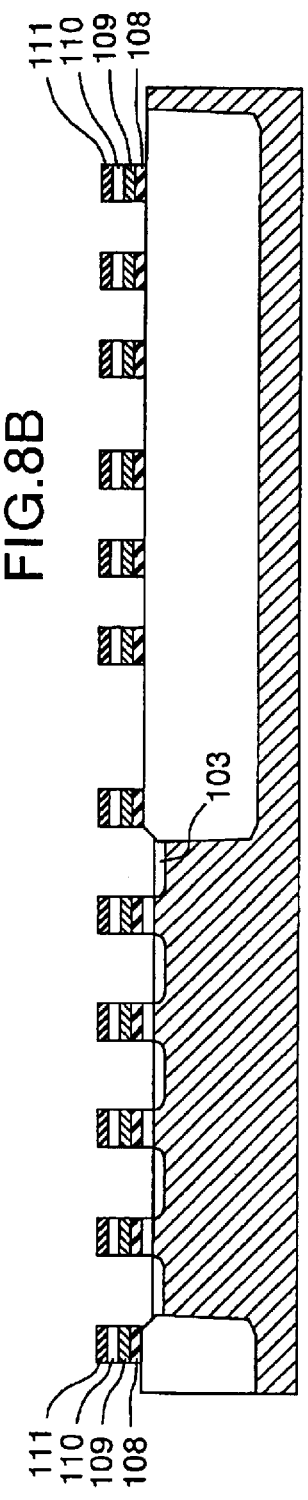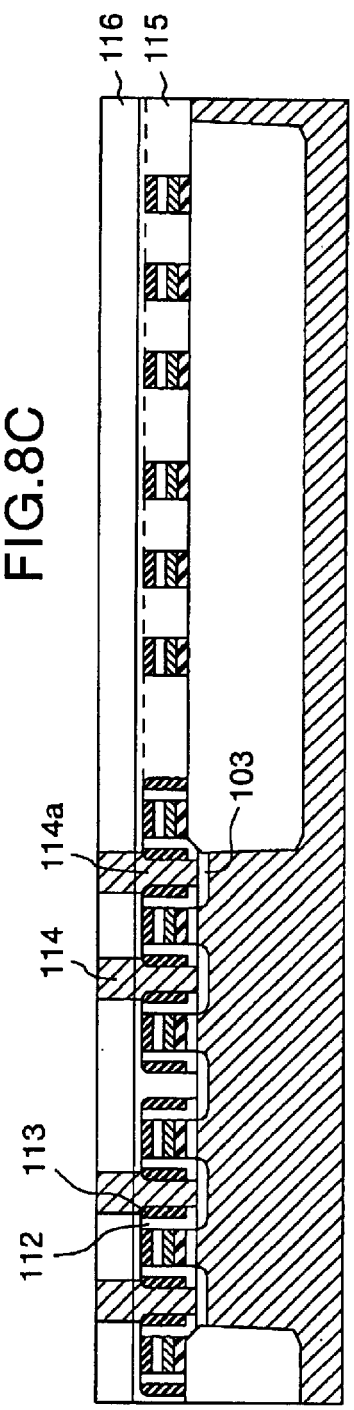

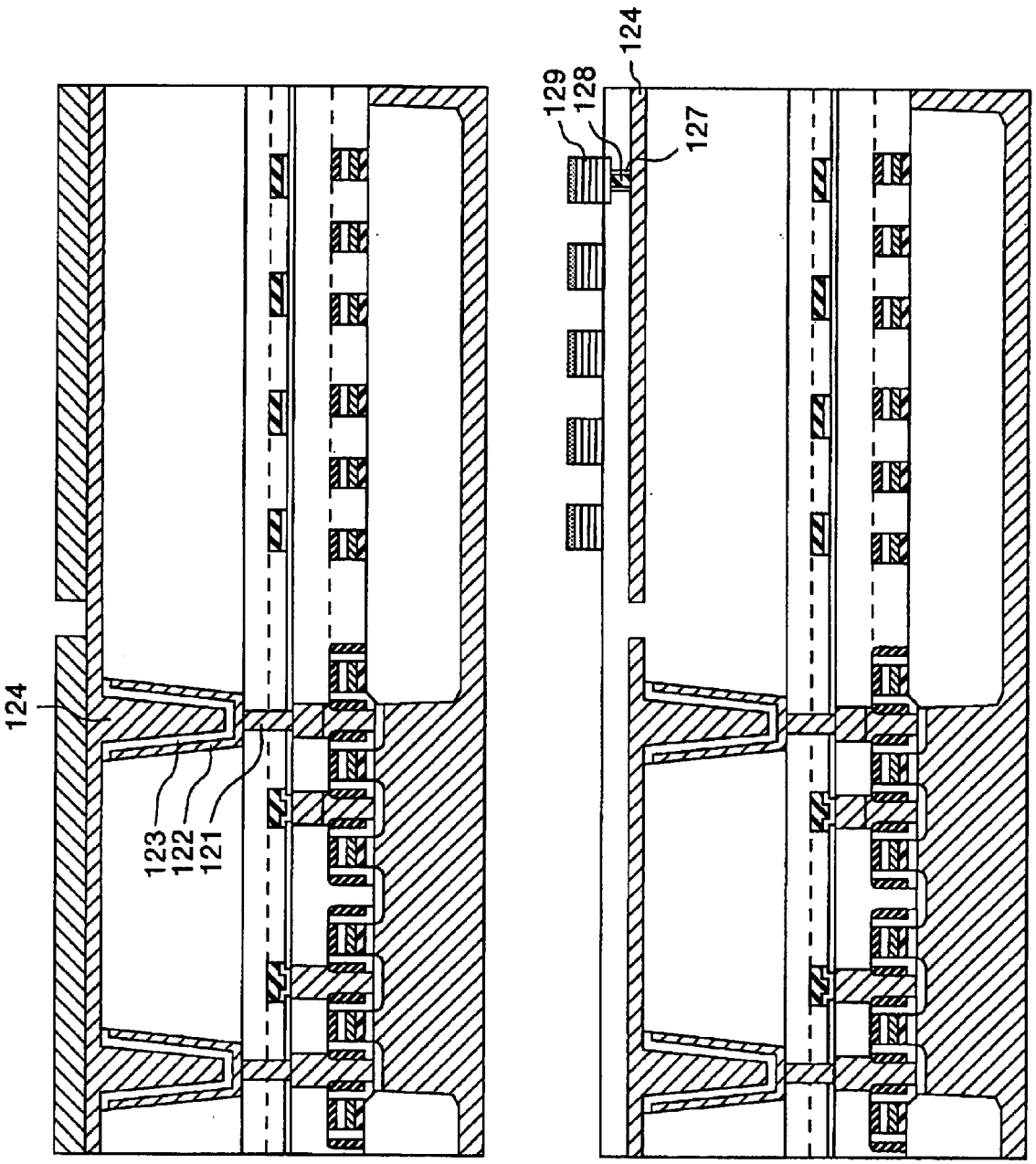

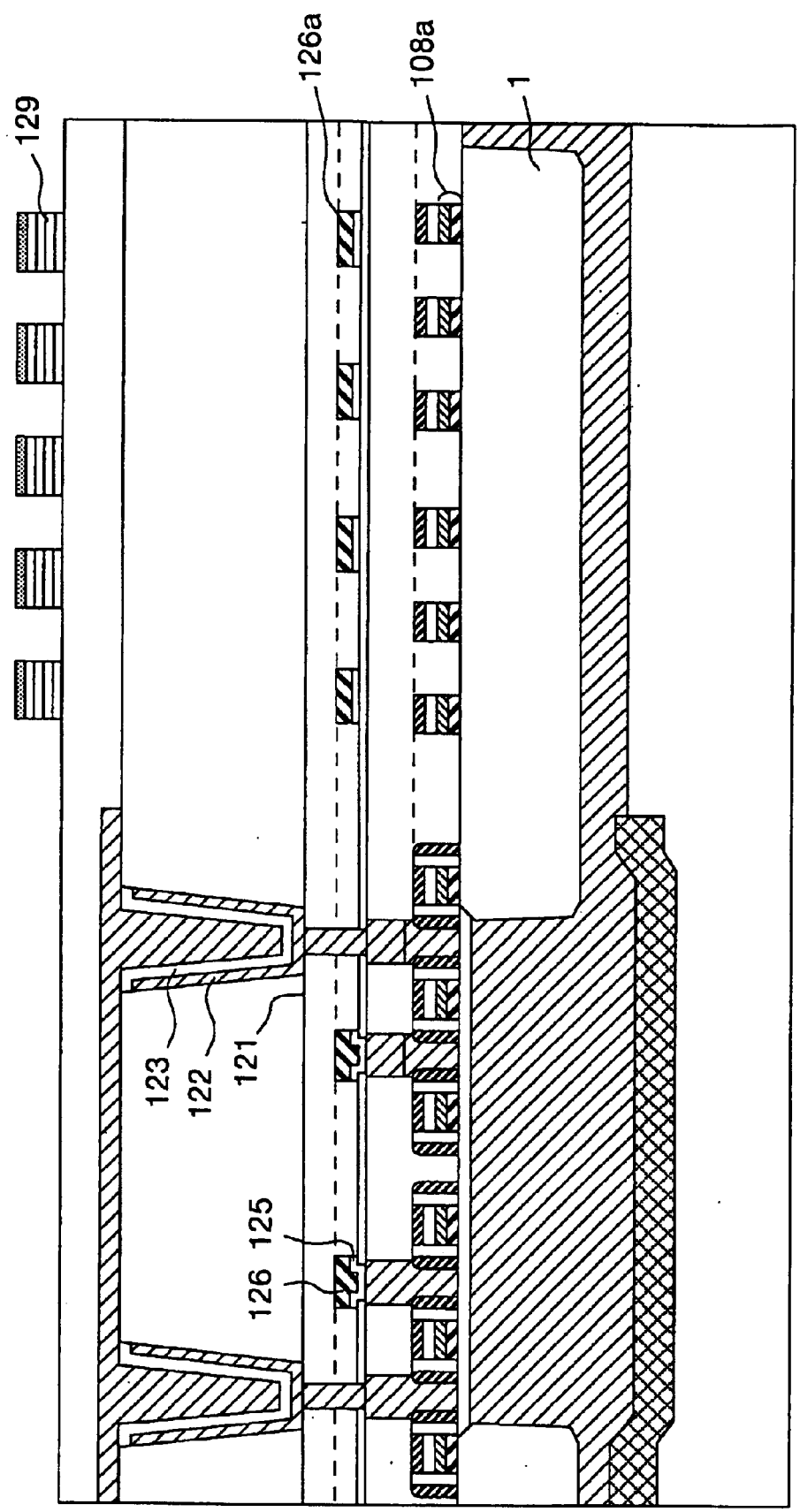

SEMICONDUCTOR DEVICE AND METHOD OF FABRICATING THE SAME

FIELD OF THE INVENTION

The present invention relates to a multilayer-circuit semiconductor device having resistors and signal line region(s) and a method of fabricating the same. Particularly, this invention relates to the semiconductor device preventing relative fluctuations in resistance among the resistors and, moreover, preventing fluctuations in interconnection capacitance (stray capacitance) because of the influence of the interconnection patterns in upper or lower layers of the signal-wiring, and to a method of fabricating this semiconductor device.

BACKGROUND OF THE INVENTION

Conventionally, data performed between LSI's, such as memories, microcomputers, and logic elements to control electrical equipment and to perform video and audio signal processing. However, eRAM (embedded RAM) obtained by integrating these LSI's into one chip, based on progress in both process and design technologies, has been intensively focused on as a new device (i.e., system LSI). The eRAM obtained by integrating ASIC's, microcomputers, and large-capacity memories can realize equipment that is more compact, has higher-speed data transfer due to expanded bus width, and has lower power consumption as compared to a combination of a general-purpose memory and a microcomputer.

As semiconductor devices are becoming still more highly integrated, the structure of the semiconductor device is becoming more and more complicated. The number of layers of a multilayer-circuit for a logic system have increased. Because of such complicated structure, the disadvantages described below have occurred. Specifically, depending on whether an interconnection pattern is present on upper or lower layers of a layer on which resistors ("resistor groups") or signal line region(s) are provided, there may occur problems, such as thermal influence over these groups and regions due to sintering during fabrication of the semiconductor, influences caused by fluctuations in stray capacitance due to a difference of thicknesses of the layers, and electrical influence during operation of the semiconductor. Accordingly, it becomes more important whether the resistor group and the signal line region located in a logic region can be operated stably.

FIG. 6A is a plan view of DRAM consolidated logic that has been conventionally used. This DRAM consolidated logic has a DRAM region E1 and a logic region E2. FIG. 13 and FIG. 14 show cross-sectional views taking along line XIII—XIII of FIG. 6A showing a structure covering a first Al interconnection layer of the DRAM consolidated logic in FIG. 6A. In this type of DRAM-logic hybrid device, a cylindrical stacked capacitor (concave) having a certain height is formed in the DRAM region E1. The stacked capacitor is composed of a lower capacitor electrode layer 122, dielectric film 123, and an upper capacitor electrode layer 124.

FIG. 13 shows an example of the DRAM consolidated logic including a region having the resistor group composed of a group of diffused resistors in the logic region E2. The resistor group arranged in the logic region E2 is provided to be used as additional resistors. In FIG. 13, the resistor group is composed of the belt-like isolation oxide films 105 spaced apart from and extending in parallel with each other on the main surface of the semiconductor substrate, and $N^+$ diffused regions 104 each extending between the belt-like isolation oxide films 105. The first Al interconnection layer 129 is located on the upper layer of the resistor group in the logic region E2.

FIG. 14 shows an example of the DRAM consolidated logic including a region having the signal interconnection in the logic region E2. In FIG. 14, two different layers of signal interconnections are located in the logic region E2, that is, a signal interconnection 126a formed by utilizing a layer common to a bit line 126 in the DRAM region E1, and a signal interconnection 108a formed by utilizing a layer common to a gate electrode in the DRAM region E1. The first Al interconnection layer 129 is located above the region having the signal interconnections 108a and 126a.

In the conventional art, however, in association with an increase in the number of interconnection layers in the logic region E2, the resistor group and the signal interconnection in the logic region E2 are affected by how a pattern is arranged on the upper layer or the lower layer. Therefore, the problems as follows occur.

Firstly, there is a problem that relative resistance within the resistor group fluctuates depending on whether a pattern is present on the first Al interconnection layer 129 as the upper layer. For example, when any faults on a substrate produced due to etching or the like during fabrication are to be removed by sintering executed after formation of the first Al interconnection, removal of the faults on the substrate may become non-uniform due to presence or absence of a pattern on the first Al interconnection layer 129 as the upper layer. Traps caused by a boundary potential on the surface of the resistors may become non-uniform within the resistor group. Therefore, fluctuations in the relative resistance within the resistor group in an analog line or the like become a problem (see FIG. 13)

Secondly, by patterning the signal interconnections 108a and 126a under the first Al interconnection layer 129, a difference in an interlayer thickness under the first Al interconnection layer 129 occurs between a portion having a signal pattern and a portion not having a signal pattern, stray capacitance to the base fluctuates, and a difference occurs between actual resistance and the simulated resistance during circuit design (see FIG. 14). The fluctuation in stray capacitance becomes a serious problem in the pattern in which a change of the signal interconnection or the like is not desirable. Further, during operation of the semiconductor device, the signal interconnection is electrically affected by the pattern of other signal interconnection on the upper layer or the lower layer. Therefore, stable signal circuit cannot be obtained.

SUMMARY OF THE INVENTION

It is an object of this invention to provide a semiconductor device having an improved resistor group and signal line region(s) which prevent fluctuations in relative resistance and stray capacitance and are not affected by patterns on other layers.

According to one aspect of this invention, a shielding layer is formed between a resistor group and a metal interconnection layer that has been provided above the resistor group. As a result, traps caused by a boundary potential on the surface of the resistors can be prevented from being non-uniform, within the resistor group, due to presence or absence of a pattern on the metal interconnection layer as the upper layer when sintering is performed after formation of the metal interconnection layer.

Therefore, relative resistance in the resistor group can be prevented from its fluctuation.

According to another aspect of this invention, a shielding layer is formed on one or both sides of a signal interconnection layer hat has been provided above the resistor group. As a result, it is possible to prevent stray capacitance to a base from its fluctuation, prevent electrical influence due to the pattern of other signal interconnection over the signal interconnection, and stabilize a signal circuit.

Other objects and features of this invention will become apparent from the following description with reference to the accompanying drawings.

BRIEF DESCRIPTION OF THE DRAWINGS

FIG. 5A and FIG. 5B are cross-sectional views showing fabrication processes of the semiconductor device as the first embodiment.

FIG. 7 is a cross-sectional view showing a structure of a semiconductor device as a second embodiment.

FIG. 8A to FIG. 8C are cross-sectional views showing fabrication processes of the semiconductor device as the second embodiment.

FIG. 11A and FIG. 11B are cross-sectional views showing fabrication processes of the semiconductor device as the second embodiment.

FIG. 14 is a cross-sectional view showing an example of the structure of the conventional DRAM consolidated logic that includes a region having a signal interconnection in the logic region.

DETAILED DESCRIPTIONS

Embodiments of the semiconductor device and the fabrication method of the same according to this invention will be explained in detail below with reference to the accompanying drawings.

Figure 1:
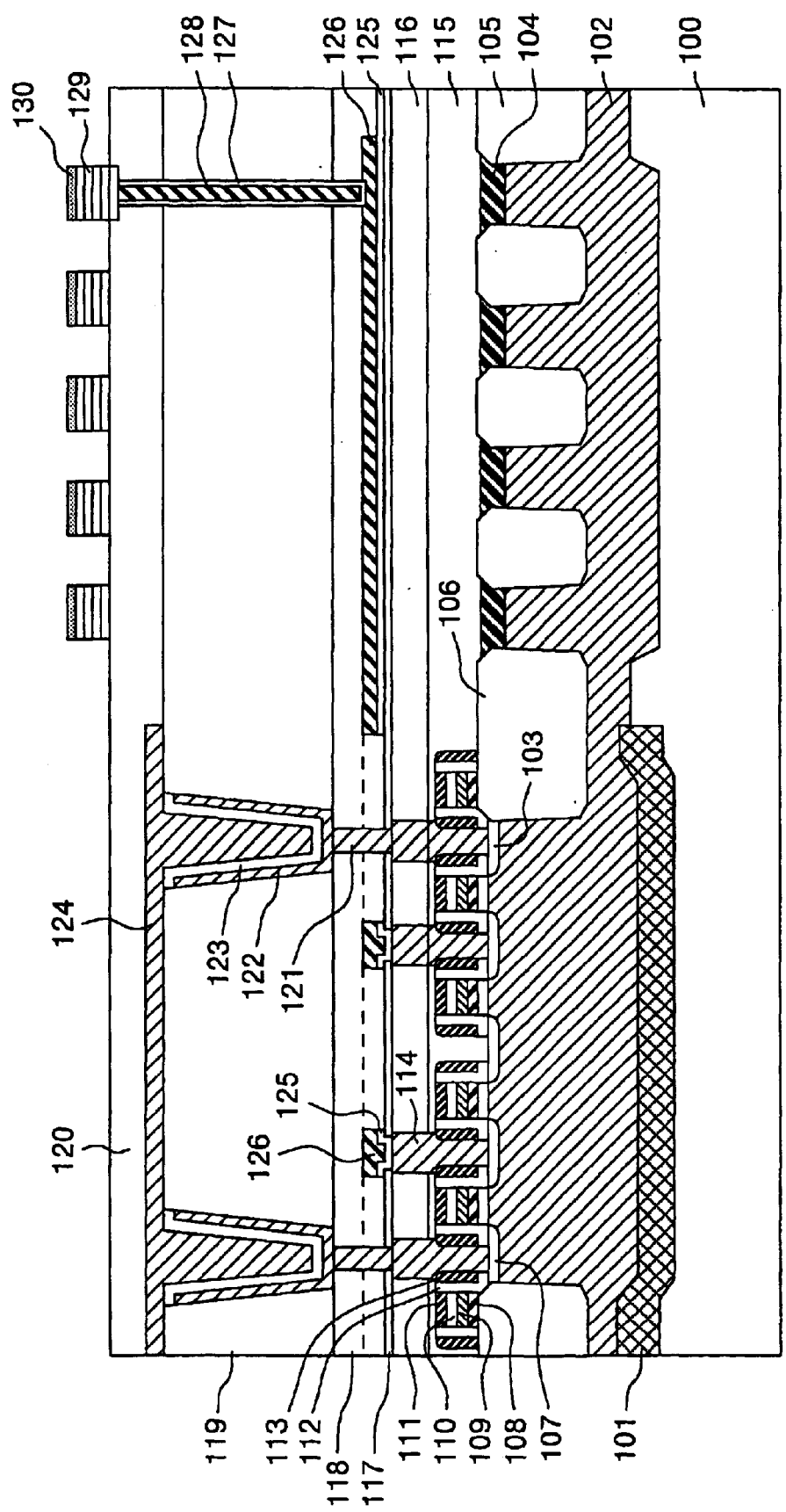
FIG. 1 is a cross-sectional view showing a structure of a semiconductor device as a first embodiment.

FIG. 1 is a cross-sectional view showing the structure of a semiconductor device according to a first embodiment of the present invention. This semiconductor device has a DRAM region E1 and a logic region E2. FIG. 1 has been simplified to show only a first metal interconnection Al interconnection layer 129, but about three to six metal interconnection layers are generally present in this type of semiconductor devices.

In FIG. 1, the legend 100 represents a semiconductor substrate made of P type Si or the like, 101 represents a bottom N well region, 102 represents a P type well region, 103 represents source/drain regions, 104 represents an $N^+$ diffused region, 105 represents an isolation oxide film, and 106 represents an element isolation region made of an oxide film. The resistor group is composed of belt-like isolation oxide films 105 spaced apart from and extending in parallel with each other on the main surface of the semiconductor substrate 100, and $N^+$ diffused regions 104 each extending between the belt-like isolation oxide films 105.

The legend 107 represents a gate oxide film made of a silicon oxide film, 108 represents a polysilicon film made of phosphorus doped polysilicon or the like, and 109 represents a silicide layer made of tungsten silicide ($WSi_2$) or the like. The polysilicon film 108 and the silicide layer 109 form a gate electrode (word line) of a transistor. Legends 110 and 111 represent insulating films that cover the gate electrode of the transistor. Legends 112 and 113 represent sidewalls. A silicon oxide film is used for 110 and 112, and a silicon nitride film is used for 111 and 113.

The legend 115 represents an interlayer insulating film made of BPSG (Boro-Phospho-Silicate-Glass) or the like, and 116 represents an interlayer insulating film made of a nitride film. The legends 114 and 121 represent plugs made of a polysilicon film such as phosphorus doped polysilicon or the like. The plug 114 makes an electrical connection between the source/drain regions 103 and the bit line 126.

In the DRAM region E1, the legend 122 represents a lower capacitor electrode layer made of phosphorus doped polysilicon or the like, 123 represents a capacitor dielectric film made of a silicon oxide film or a silicon nitrided oxide film, and 124 represents an upper capacitor dielectric film made of phosphorus doped polysilicon or the like. The legends 117 to 119 represent interlayer insulating films made of an oxide film or the like. The legend 120 represents an interlayer insulating film made of TEOS (Tetraethoxysilane) or the like.

The lower capacitor electrode layer 122 and the upper capacitor electrode layer 124 are electrically insulated by the capacitor dielectric film 123. The lower capacitor electrode layer 122, capacitor dielectric film 123, and the upper capacitor electrode layer 124 form a cylindrical stacked capacitor. The legend 125 represents barrier metal made of TiN/Ti or the like, and 126 represents a bit line for fetching data from a memory cell, and the bit line is made of tungsten (W) or the like. The source/drain regions 103 and the lower capacitor electrode layer 122 of the stacked capacitor are connected to each other through the plugs 114 and 121.

In this DRAM region E1, the memory cell is formed with a MOS transistor comprising a gate electrode, source, and drain, and the stacked capacitor.

In the logic region E2, the legend 127 represents barrier metal made of TiN/Ti or the like, 129 represents a first Al interconnection layer made of AlCu or the like, and 128 represents a metal plug (herein W plug) making a connection between the first Al interconnection layer 129 and the bit line 126. The metal plug 128 may also be used in the memory cell block.

The fabrication process of the semiconductor device according to the first embodiment will be explained below.

FIG. 2A to FIG. 5B are cross-sectional views showing fabrication processes of this semiconductor device. The portion on the left in FIG. 2A to FIG. 5B is the DRAM region E1, and the portion on the right is the logic region E2. The fabrication method after the formation of the MOS transistors in the DRAM region E1 and a resistor group in the logic region E2 will be explained below. It should be noted that, the process before the formation of the transistors and the resistor group is essentially performed using the ordinary semiconductor process technology.

MOS transistors each comprising the gate electrode, source, and the drain are formed in the DRAM region E1. The resistor group is formed in the logic region E2 as follows. This resistor group is composed of the belt-like isolation oxide films 105 in the logic region E2 and the $N^+$ diffused regions 104 each extending between the isolation oxide films (see FIG. 2A).

Figure 2A:
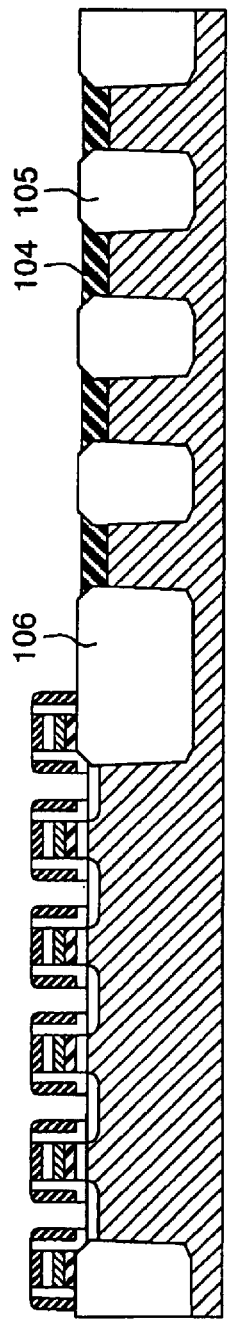
FIG. 2A to FIG. 2C are cross-sectional views showing fabrication processes of the semiconductor device as the first embodiment.
Figure 2B:
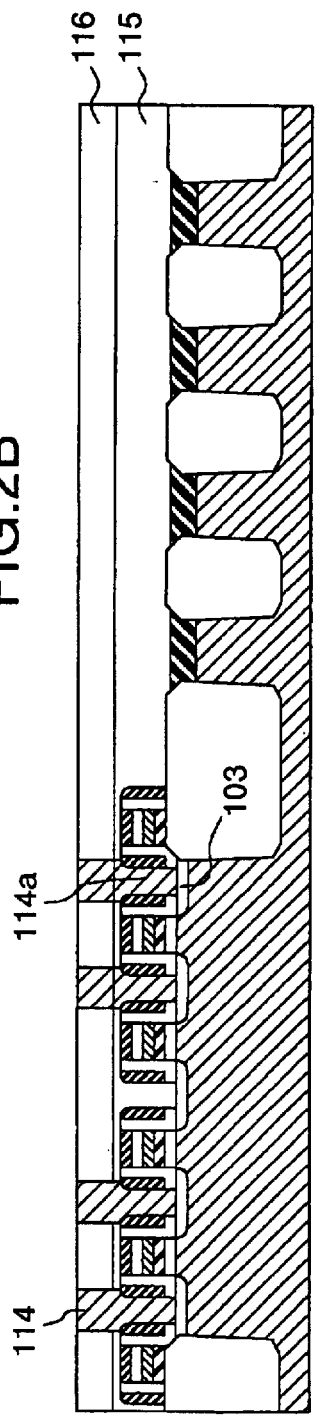

The BPSG 115 and the nitride film 116 are layered so that the MOS transistors are embedded, contact holes 114a are formed by the self-aligned contact technique to be connected to the source/drain regions 103, and each of the contact holes 114a is filled with phosphorus doped polysilicon 114 to form a contact (see FIG. 2B).

Figure 2C:
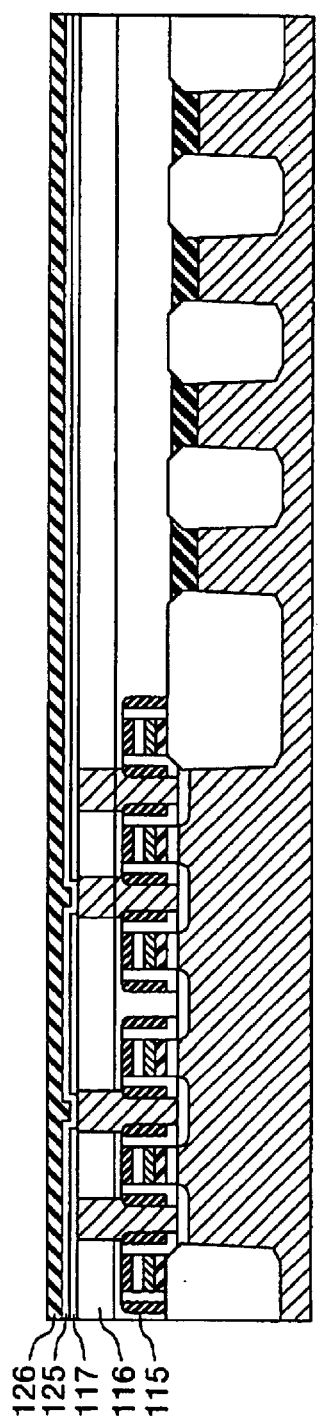

The interlayer insulating film 117 made of an oxide film is formed, contact holes are formed in portions where bit lines should be formed, and films made of barrier metal (TiN/Ti) 125 and tungsten (W) 126 are then formed (see FIG. 2C).

Figure 3A:
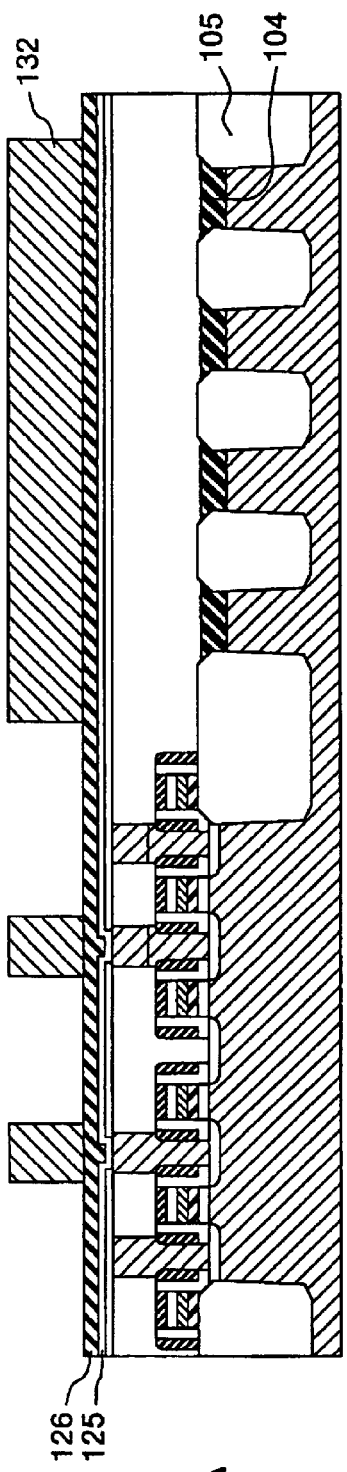
FIG. 3A to FIG. 3C are cross-sectional views showing fabrication processes of the semiconductor device as the first embodiment.
Figure 3B:
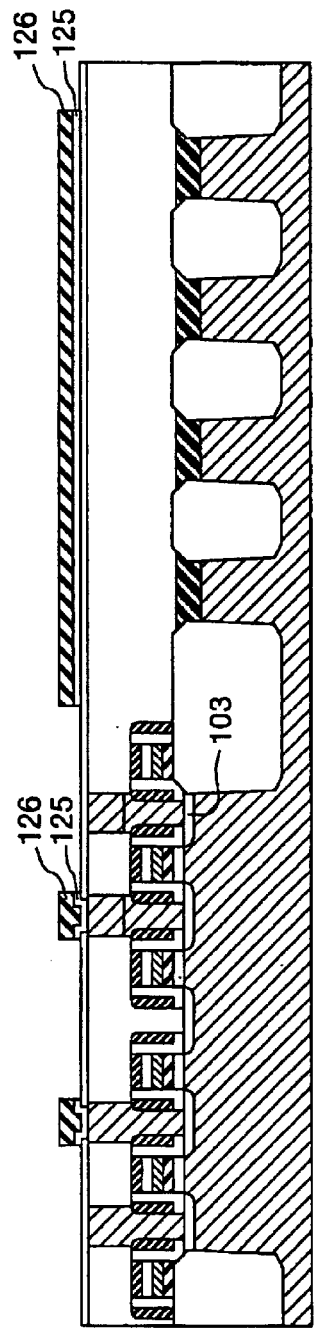
Figure 3C:
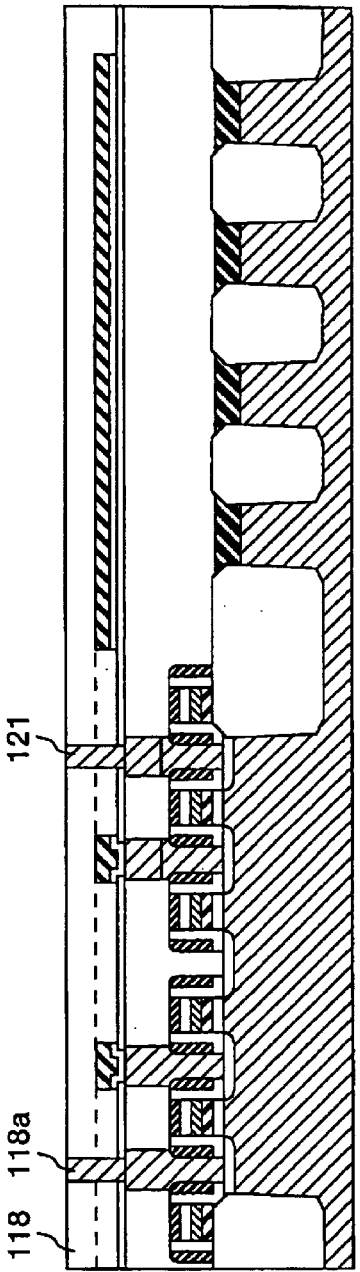

Photolithography is then performed using a photoresist 132 (see FIG. 3A), and the barrier metal (TiN/Ti) 125 and W 126 are etched to form a pattern of the bit lines in the DRAM region E1 (see FIG. 3B). That is, the photoresist 132 is uniformly applied onto the W 126, and the bit line pattern is formed through the photolithography. During this process, the pattern is also formed on the upper layer of the resistor group in the logic region E2 where the bit line is not originally formed, in addition to the DRAM region E1 where the bit line is formed. Thereby, a shielding layer made of the barrier metal (TiN/Ti) 125 and W 126 is formed on the upper layer of the resistor group in the logic region.

Figure 6A:
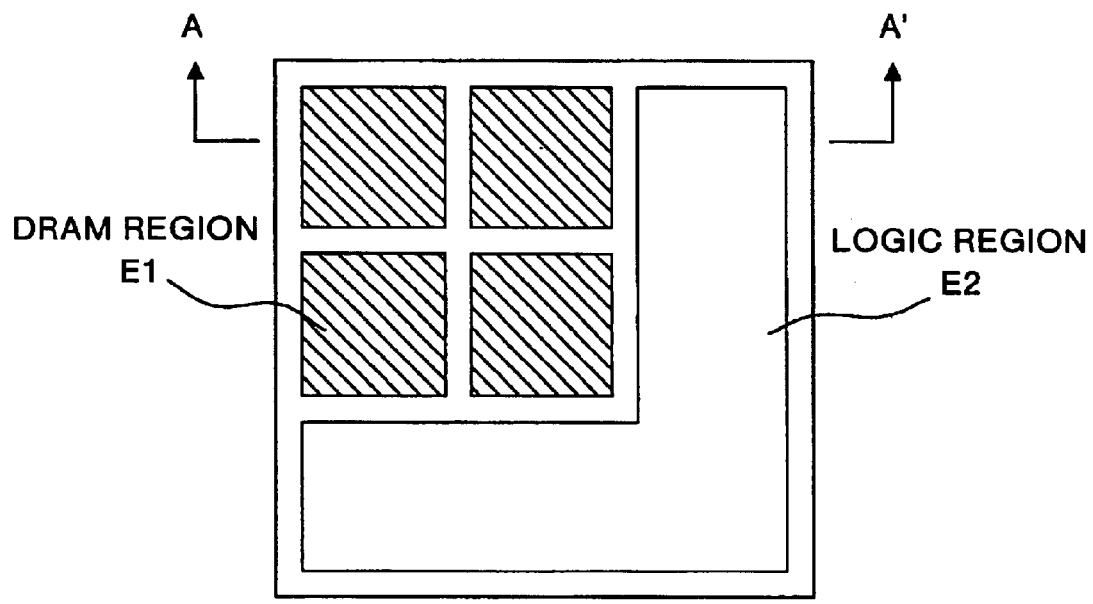
FIG. 6A is a plan view of the overall semiconductor device as the first embodiment.
Figure 6B:
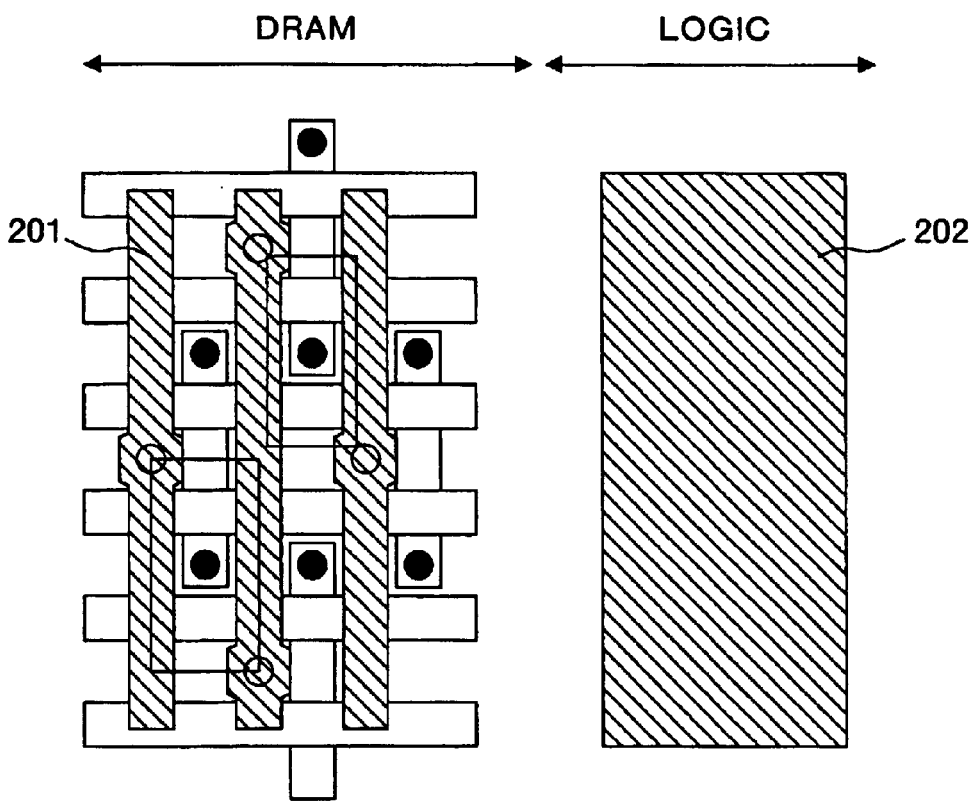
FIG. 6B is an enlarged plan view of a boundary between a DRAM region and a logic region.

FIG. 6A and FIG. 6B show plan views of a mask pattern for the photolithography used for this process. FIG. 6A is a plan view of the overall semiconductor device and FIG. 6B is an enlarged plan view of a boundary between the DRAM region E1 and the logic region E2. In FIG. 6B, the legend 201 shows a position of the bit line pattern and 202 shows a position of the shielding layer pattern in the logic region E2. In the patterns shown in FIG. 6B, the bit line pattern 201 is formed in the DRAM region E1, and the shielding layer pattern 202 is also formed on the upper layer of the resistor group in the logic region E2 where the bit line pattern is not generally needed. Thereby, the shielding layer is formed in the logic region E2 by utilizing the layer common to the bit line in the DRAM region E1.

Conventionally, during this process, the bit line pattern has been formed only in the DRAM region E1 where the bit line should be formed. Therefore, when some faults on the substrate produced through etching during the fabrication process are to be recovered by sintering after formation of the first Al interconnection layer 129, the faults on the substrate are recovered nonuniformly due to presence or absence of a pattern on the first Al interconnection layer 129 as the upper layer. Traps caused by a boundary potential on the surface of the resistors then become nonuniform within the resistor group. Accordingly, there occurs a problem that relative resistance of the resistor group in an analog circuit or the like fluctuates.

On the other hand, in the first embodiment, the bit line pattern 201 is formed in the DRAM region E1, and the shielding layer pattern 202 is also formed on the upper layer of the resistor group in the logic region E2 where the bit line pattern is not generally needed. Therefore, it is possible to suppress the influence due to presence or absence of the pattern on the first Al interconnection layer 129 as the upper layer at the time of sintering, which makes it possible to resolve the problem.

In FIG. 6B, the shielding layer pattern 202 is a solid pattern that covers the whole resistor group, but this shielding layer pattern 202 is not limited by this pattern if the pattern follows the object of this invention that protects the resistor group. For example, the shielding layer pattern 202 may be meshed.

Subsequently, the interlayer insulating film 118 made of an oxide film is layered so that the bit lines 126 are embedded. Contact holes 118a are formed in portions where capacitors are to be formed in the process performed afterward. Each of the contact hole 118a is filled with phosphorus doped polysilicon to form a plug 121 (see FIG. 2C).

Figure 4A:
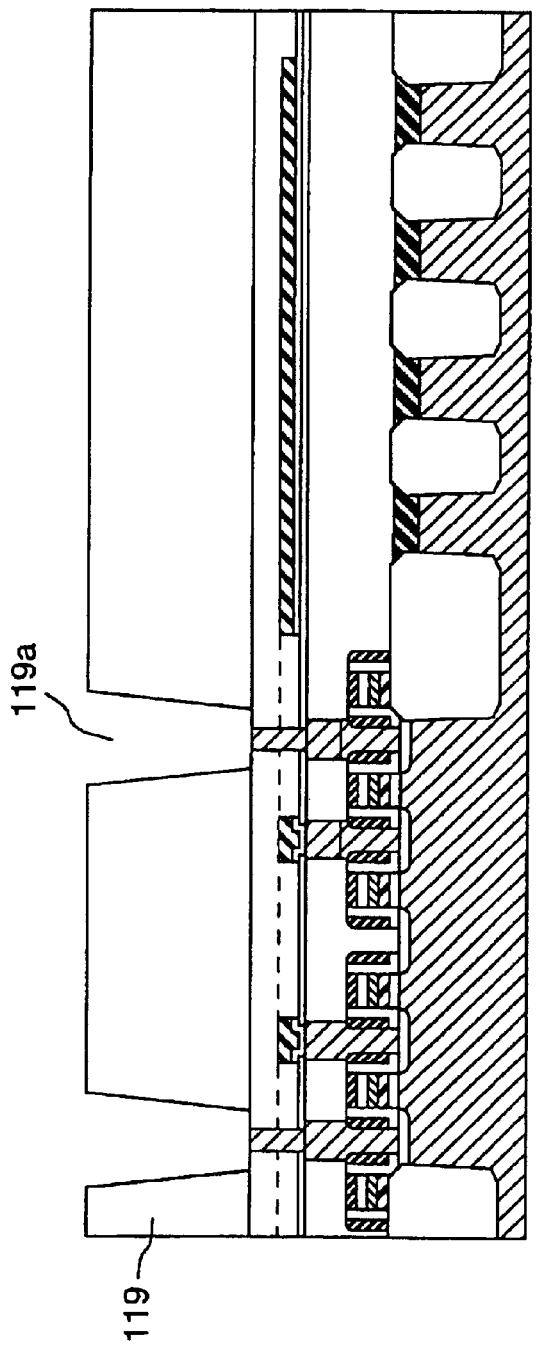
FIG. 4A and FIG. 4B are cross-sectional views showing fabrication processes of the semiconductor device as the first embodiment.
Figure 4B:
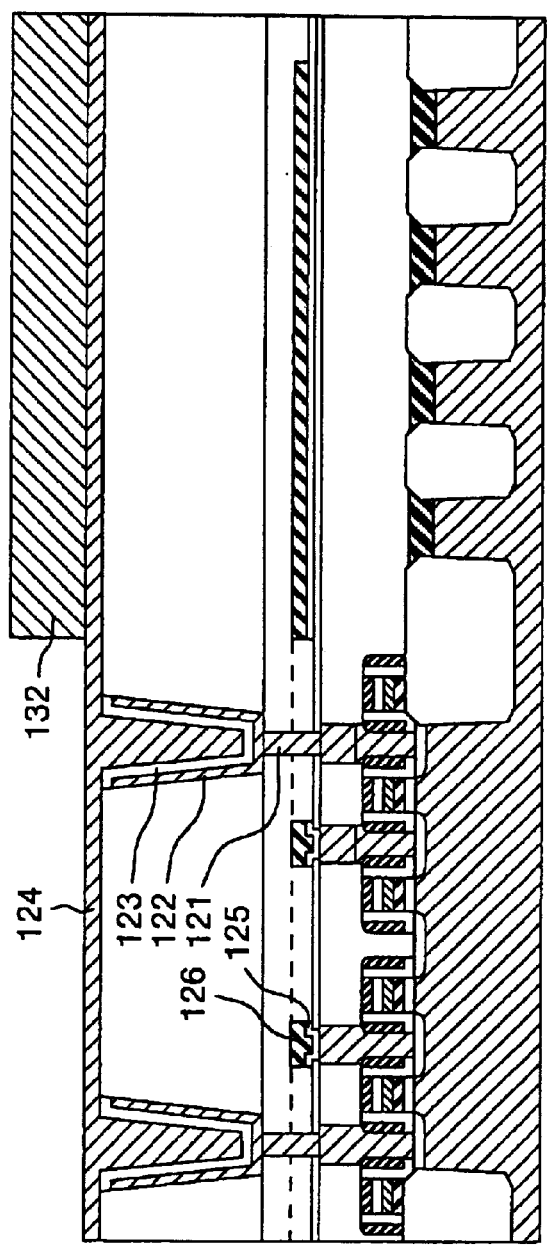

The interlayer insulating film 119 made of an oxide film is then layered, and cylindrical holes for capacitors are formed in the interlayer insulating film 119 (see FIG. 4A).

The lower capacitor electrode 122 made of doped polysilicon such as phosphorus doped polysilicon or doped amorphous silicon is provided along the internal wall of the capacitor hole 119a formed in the interlayer insulating film 119. A capacitor dielectric film 123 made of a silicon oxide film or silicon nitrided oxide film is formed so as to cover the lower capacitor electrode 122. Subsequently, an upper capacitor electrode layer 124 made of polysilicon or the like is deposited over the whole surface including the DRAM region E1 and the logic region E2, photolithography is then performed using the photoresist 132 (see FIG. 4B), and the upper capacitor electrode layer 124 is etched to form a cell plate pattern (see FIG. 5A).

The interlayer insulating film 120 made of TEOS is formed over the whole surface of the semiconductor substrate, and the surface of the interlayer insulating film 120 is polished and flattened using the CMP method. In order to fix the potential of the shielding layer in the logic region E2 obtained by using the bit line 126, a contact hole is formed in the logic region E2. Barrier metal (Tin/Ti) 127 and W 128 are formed along the hole, and W 128 and the barrier metal 127 on the surface of the semiconductor are polished and removed again by using the CMP method to form a W plug 128. The first Al interconnection layer 129 is formed on the interlayer insulating film 120. At this time, by forming the first Al interconnection layer 129 on the W plug 128, the potential of the shielding layer is fixed (see FIG. 5B).

In the first embodiment, the diffused resistors formed with the $N^+$ diffused regions 104 and isolation oxide films 105 as a resistor group are taken up as an example for explanation. However, even when the resistor group is provided in the logic region E2 by utilizing the layers common to the gate line and bit line in the DRAM region E1, a shielding layer can be provided between the resistor group and the first Al interconnection layer 129 by utilizing a layer common to the layer in the DRAM region E1. For example, when the resistor group is provided in the logic region E2 by utilizing the gate line, a shielding layer composed of the bit lines 126 and the upper capacitor electrode layer 124 in the DRAM region E1 can be formed. Further, when the resistor group is provided in the logic region E2 by utilizing the bit line, a shielding layer composed of the upper capacitor electrode layer 124 in the DRAM region E1 can be formed.

In accordance with the first embodiment, by providing the shielding layer between the resistor group (104, 105) in the logic region E2 and the first Al interconnection layer 129 utilizing the layer common to the bit line in the DRAM region E1, defects on the substrate due to sintering can be uniformly recovered. Thus, fluctuation in the relative resistance of the resistor group can be prevented.

A second embodiment of the semiconductor device according to the present invention will now be explained. FIG. 7 is a cross-sectional view showing the configuration of the semiconductor device according to the second embodiment. This semiconductor device is composed of a DRAM region E1 and a logic region E2. The portion on the left in FIG. 7 is the DRAM region and the portion on the right is the logic region. The common legends between the first embodiment and the second embodiment represent the same components, and only different parts will be explained in detail below.

In the second embodiment, two different layers of signal interconnections are formed in the lower layer of the first Al interconnection layer 129 in the logic region E2. The signal interconnections are a signal interconnection 126a formed by utilizing the layer common to the bit line 126 in the DRAM region E1 and a signal interconnection 108a formed by utilizing the layer common to the gate electrode (108, 109) in the DRAM region E1. This second embodiment is characterized in that a shielding layer is provided by utilizing the upper capacitor electrode layer 124 in the DRAM region E1, between the first Al interconnection layer 129 and the signal interconnection formed by utilizing the layer common to the bit line 126. Accordingly, the interlayer film thickness with respect to the first Al interconnection layer 129 becomes uniform. Thus, fluctuation in stray capacitance can be prevented from its occurrence caused by whether the signal interconnection pattern is arranged in the lower layer.

The fabrication process of the semiconductor device composed of the DRAM region E1 and the logic region E2 of the second embodiment will be explained below. FIG. 8A to FIG. 8C, FIG. 9A to FIG. 9C, FIG. 10A, FIG. 10B, FIG. 11A, and FIG. 11B are cross-sectional views showing the fabrication processes of the semiconductor device as the second embodiment. In the figures, the left hand side shows a DRAM region and the right hand side shows a logic region. The fabrication process after the element isolation region 106 is formed will be explained below. The process before this process is performed using the ordinary semiconductor process technology.

After the element isolation region 106 is formed, a gate oxide film 107 is grown on an exposed P type well region 102. A polysilicon film 108 such as phosphorus doped polysilicon, silicide layer 109 such as $WSi_2$, silicon oxide film 110, and a silicon nitride film 111 are then layered over the whole surface of the gate oxide film 107 in this order. The photoresist 132 is uniformly applied to the W 126, and the gate electrode pattern is formed through photolithography (see FIG. 8A). In this second embodiment, an interconnection pattern is also provided in the logic region E2 by utilizing a layer common to the gate electrode (108, 109), therefore, a mask pattern of the photoresist 132 is provided in both the DRAM region E1 and the logic region E2.

The gate oxide film 107, polysilicon film 108, silicide layer 109, silicon oxide film 110, and the silicon nitride film 111 are etched using the photoresist 132 as a mask. A gate electrode pattern is formed in the DRAM region E1, and at the same time, an interconnection pattern is formed in the logic region E2 by utilizing the gate electrode layer. As shown in FIG. 8B, the insulating layers 110 and 111 may be left as they are. Arsenic ions or the like are shot into the surface of the substrate by means of the ion implantation method using the obtained gate electrode pattern as a mask to form N type source/drain regions 103 in a self-aligned manner (see FIG. 8B).

Sidewalls 112 and 113 are formed in the gate electrode to form a MOS transistor. BPSG 115 and a nitride film 116 are layered so that the formed MOS transistors are embedded. Contact holes 114a are formed by the self-aligned contact technique to be connected to the source/drain regions 103. Each of the contact hole 114a is filled with phosphorus doped polysilicon 114 to form a contact (see FIG. 8C).

Figure 9A:
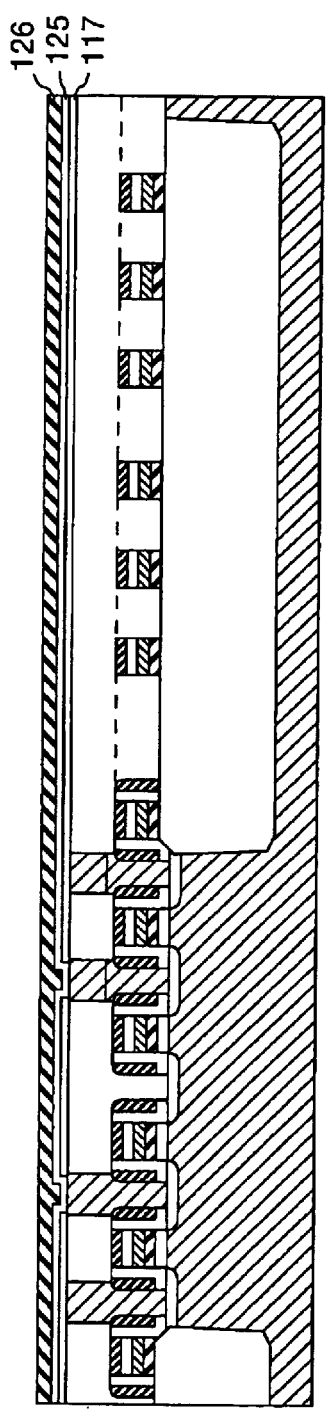
FIG. 9A to FIG. 9C are cross-sectional views showing fabrication processes of the semiconductor device as the second embodiment.
Figure 9B:
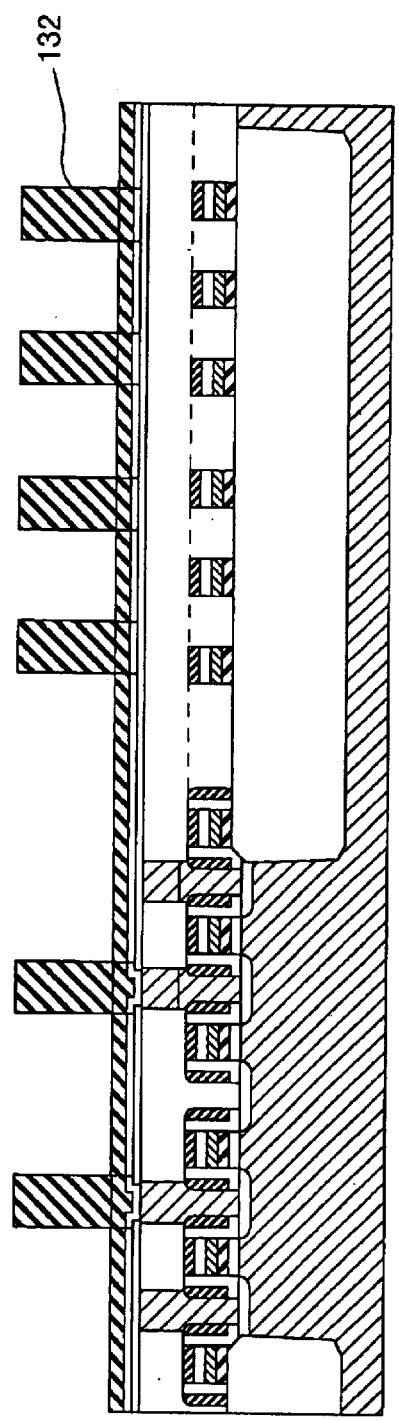

An interlayer insulating film 117 made of an oxide film is then formed, contact holes are formed in portions where bit lines are formed, and films of barrier metal (TiN/Ti) 125 and W 126 are formed (see FIG. 9A).

Photolithography is then performed using the photoresist 132. In the second embodiment, in order that an interconnection pattern is also formed in the logic region E2 by utilizing the layer common to the bit line 126, a mask pattern of the photoresist 132 is provided in both the DRAM region E1 and the logic region E2 (see FIG. 9B).

Figure 9C:
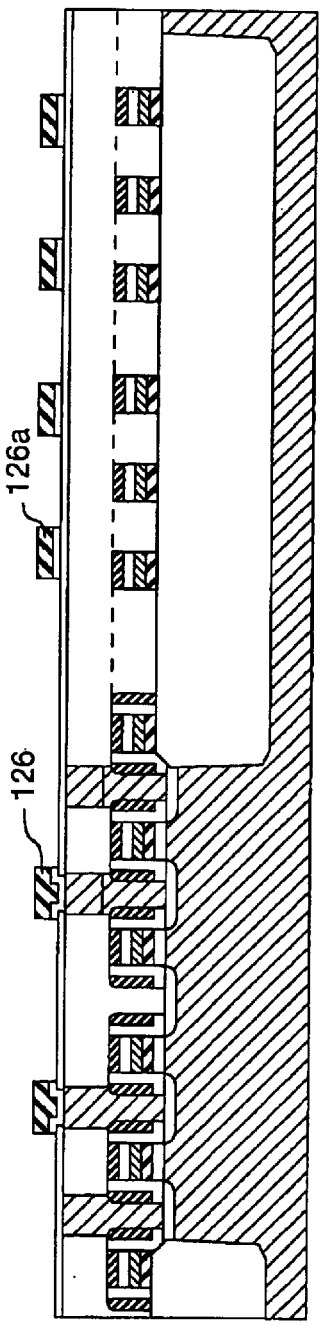

Barrier metal (TiN/Ti) 125 and W 126 are then etched to form a pattern of the bit lines 126 in the DRAM region E1 and also form an interconnection pattern 126a in the logic region E2 (see FIG. 9C).

An interlayer insulating film 118 made of an oxide film is then layered so that the bit lines 126 are embedded. Contact holes 118a are formed in portions where capacitors will be formed in the process performed afterward, and each of the contact hole 118a is filled with phosphorus doped polysilicon to form a plug 121 (see FIG. 10A).

Figure 10A:
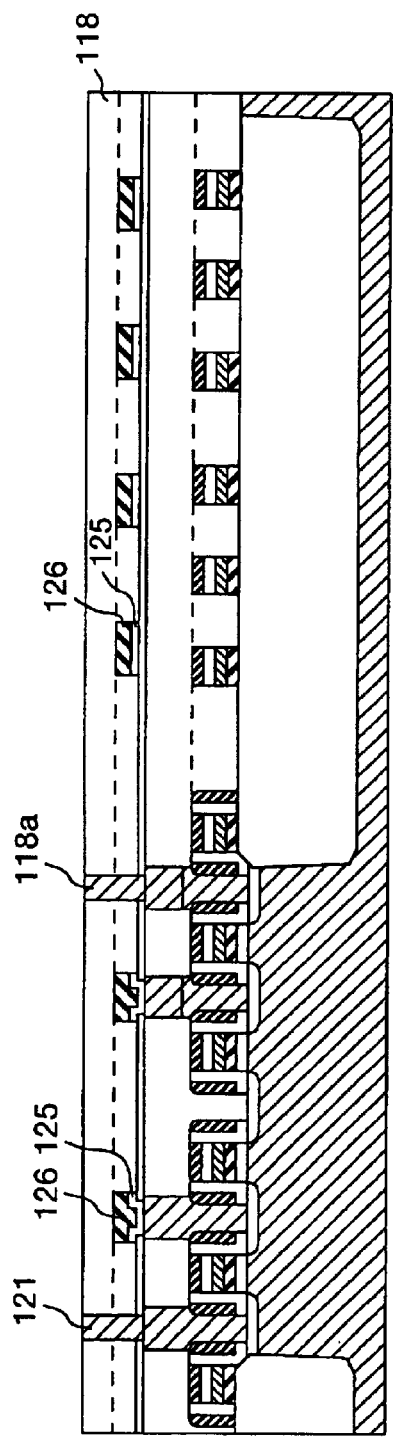
FIG. 10A and FIG. 10B are cross-sectional views showing fabrication processes of the semiconductor device as the second embodiment.
Figure 10B:
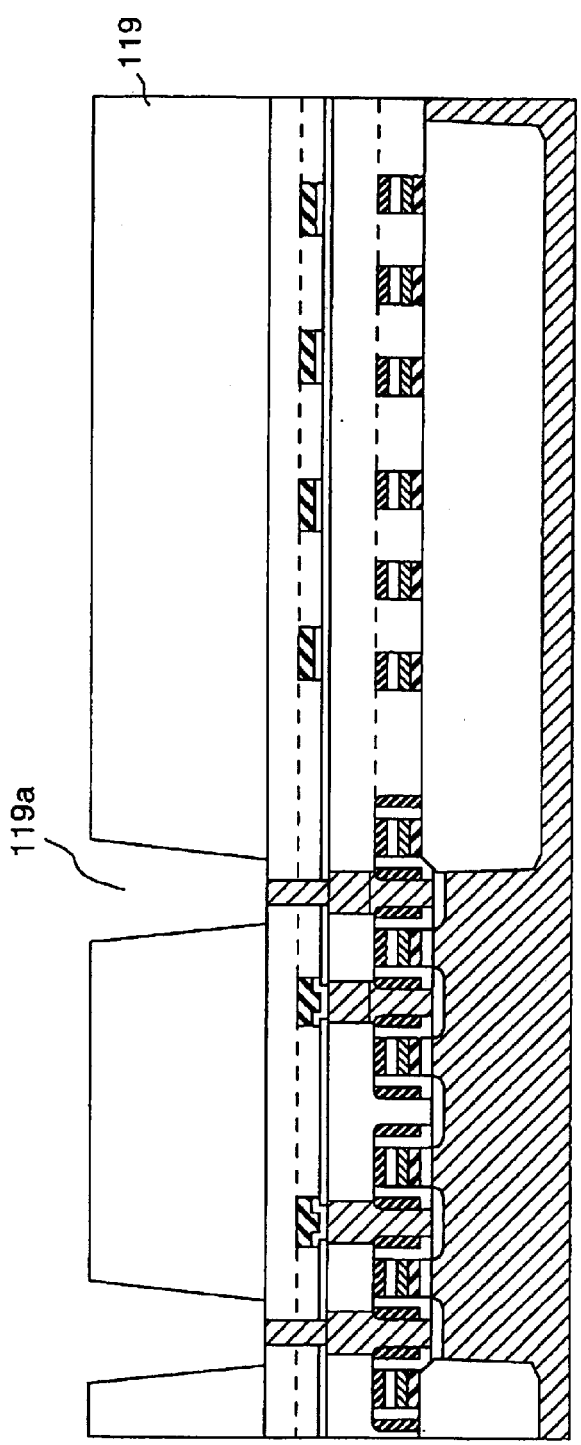

An interlayer insulating film 119 made of an oxide film is layered over the whole surface of the interlayer insulating film 118, and cylindrical capacitor holes are formed in the interlayer insulating film 119 (see FIG. 10B)

A lower capacitor electrode 122 made of doped polysilicon such as phosphorus doped polysilicon or doped amorphous silicon is provided along the internal wall of the capacitor hole 119a formed in the interlayer insulating film 119. A capacitor dielectric film 123 made of a silicon oxide film or silicon nitrided oxide film is formed so as to cover the lower capacitor electrode layer 122. Subsequently, an upper capacitor electrode layer 124 made of polysilicon or the like is deposited over the whole surface including the DRAM region E1 and the logic region E2 (see FIG. 11A). Conventionally, photolithography has been performed using the photoresist 132 and the upper capacitor electrode layer 124 in the logic region E2 has been etched. However, this invention is characterized in that the upper capacitor electrode layer 124 is utilized as a shielding layer by leaving this upper capacitor electrode layer 124 also in the logic region E2 which does not originally require this upper capacitor electrode layer 124. Accordingly, the film thickness of the interlayer insulating film 120 as a base of the first Al interconnection layer 129 becomes uniform. Thus, fluctuation in stray capacitance can be prevented from its occurrence, in the first Al interconnection layer 129, caused by whether the signal interconnection pattern is arranged in the lower layer.

An interlayer insulating film 120 made of TEOS is then formed over the whole surface of the semiconductor substrate, and the surface of the interlayer insulating film 120 is polished and flattened using the CMP method. In order to fix the potential of the upper capacitor electrode layer 124, a contact hole is formed in the logic region E2. Barrier metal (Tin/Ti) 127 and W 128 are formed along the hole, and the W128 and the barrier metal 127 on the surface of the semiconductor are polished and removed again by using the CMP method to form a W plug 128. A first Al interconnection layer 129 is formed on the interlayer insulating film 120. At this time, by forming the first Al interconnection layer 129 on the W plug 128, the potential of the upper capacitor electrode layer 124 is fixed (see FIG. 11B).

In the second embodiment, the two layers of the bit line layer 126 and the gate electrode layer (108, 109) are used as signal interconnections in the lower layer of the first Al interconnection layer 129 in the logic region E2. However, only the bit line layer 126 may be used as a signal interconnection, or only the gate electrode layer (108, 109) may be used as the signal interconnection. When only the gate electrode layer (108, 109) is used as the signal interconnection, a shielding layer maybe formed by utilizing the upper capacitor electrode layer 124 in the DRAM region E1 like in the second embodiment, but a shielding layer may be formed by utilizing the layer common to the bit line in the DRAM region E1.

In accordance with the second embodiment, by providing the shielding layer between the first Al interconnection layer 129 and the signal interconnection in the lower layer by utilizing the upper capacitor electrode layer 124 in the DRAM region E1, the film thickness of the interlayer insulating film 120 becomes uniform. Therefore, fluctuation in stray capacitance can be prevented from its occurrence, in the first Al interconnection layer 129, caused by whether the signal interconnection pattern is arranged in the lower layer. Further, during operation of the semiconductor, electrical influence between the first Al interconnection layer 129 and other signal interconnection can be prevented, thus obtaining a stable signal circuit.

Figure 12:
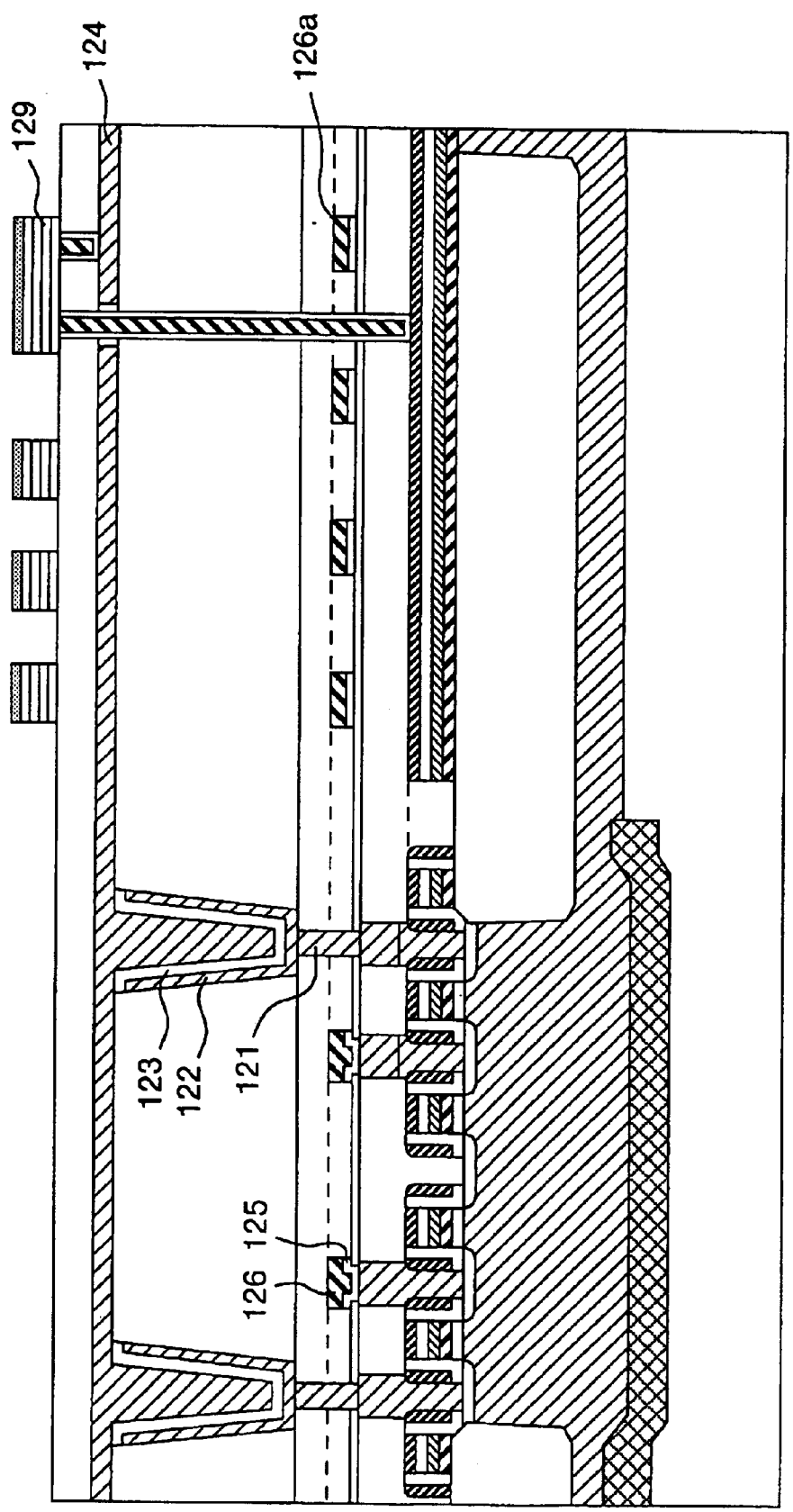
FIG. 12 is a cross-sectional view showing a structure of a semiconductor device as a third embodiment.
Figure 13:
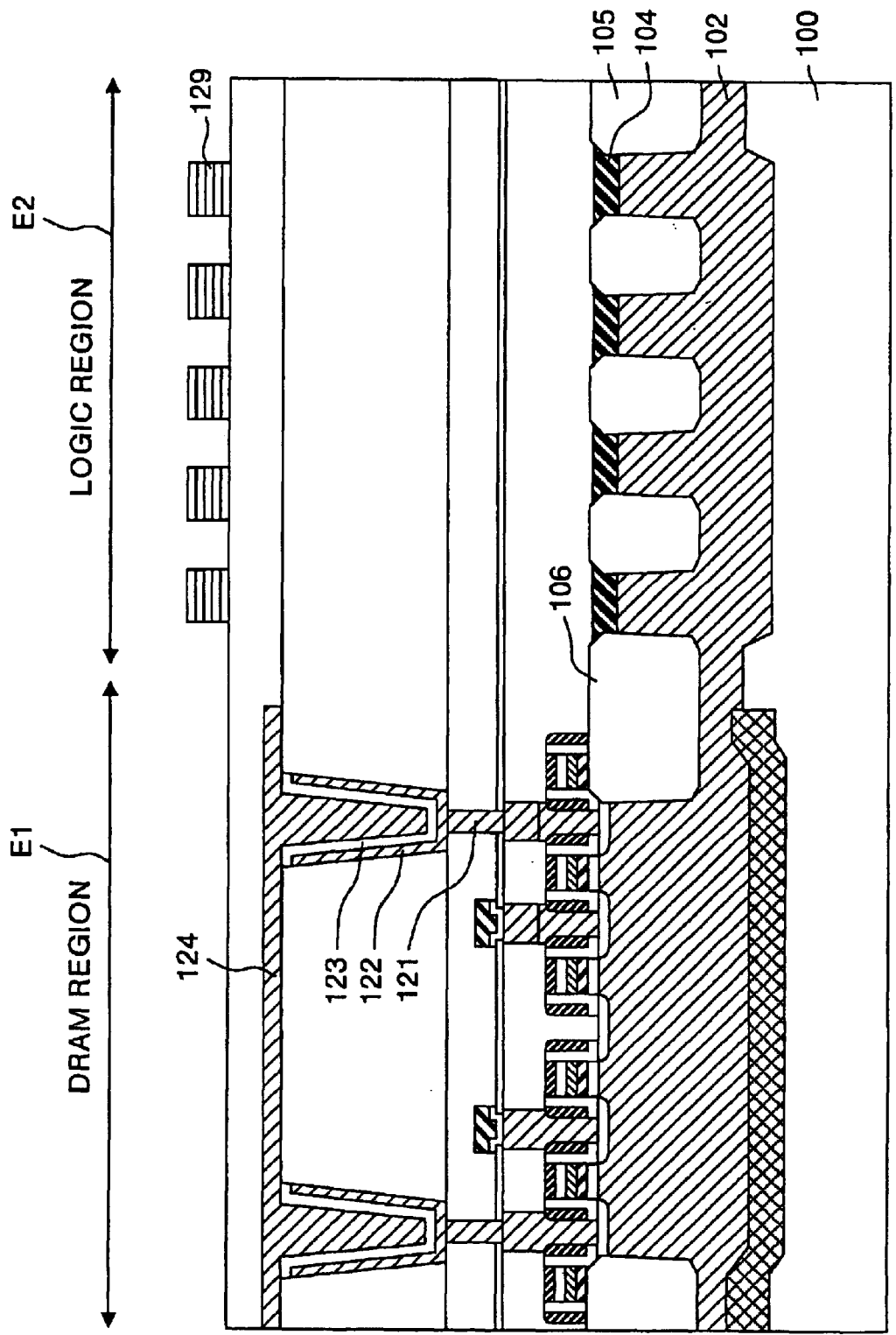
FIG. 13 is a cross-sectional view showing an example of the structure of the conventional DRAM consolidated logic that includes a region having a resistor group in the logic region.

A third embodiment of the semiconductor device according to the present invention will now be explained. FIG. 12 is a cross-sectional view showing the configuration of the semiconductor device according to the third embodiment. This semiconductor device is composed of a DRAM region E1 and a logic region E2. The left hand side of the figure shows the DRAM region E1 and the right hand side shows the logic region E2. The common legends between the first embodiment and the third embodiment represent the same components, and only different parts will be explained in detail below.

The third embodiment is an application of the second embodiment. This third embodiment is characterized in that one layer of signal interconnection is formed by utilizing the bit line 126 in the lower layer of the first Al interconnection layer 129 in the logic region E2, and a shielding layer is formed by utilizing a gate electrode in the lower layer of the signal interconnection obtained by utilizing the bit line 126, and a shielding layer is also formed by utilizing the upper capacitor electrode layer 124 between the bit line 126 and the first Al interconnection layer 129. That is, in the third embodiment, the signal interconnection 126a obtained by utilizing the bit line is sandwiched by the shielding layers in its upper and lower layers. Therefore, fluctuation in stray capacitance can be prevented from its occurrence caused by whether not only a lower-layer signal interconnection pattern but also an upper-layer signal interconnection pattern are arranged.

The semiconductor device of this third embodiment can be fabricated in the substantially same fabrication process as that of the semiconductor device according to the second embodiment except one point that the gate electrode layer in the logic region E2 is formed as a solid pattern.

As explained above, according to one aspect of this invention, by forming the shielding layer between the resistor group and the metal interconnection layer, traps caused by a boundary potential on the surface of the resistors can be prevented from being nonuniform, within the resistor group, due to presence or absence of a pattern on the metal interconnection layer as the upper layer when sintering is performed after formation of the metal interconnection layer. Therefore, there is an advantageous effect that relative resistance in the resistor group can be prevented from its fluctuation.

According to another aspect of this invention, by forming the shielding layer on the upper layer and/or the lower layer of the signal interconnection layer, there is an advantageous effect that it is possible to prevent stray capacitance to the base from its fluctuation, prevent electrical influence over the signal interconnection due to the patterns of the signal interconnections on the upper and lower layers, and stabilize a signal circuit.

Further, by using the layer common to the gate electrode layer in the DRAM region as the shielding layer in the logic region, there is an advantageous effect that the resistor group and/or the signal interconnection layer in the logic region can be protected without providing a particular shielding layer.

Further, by using the layer common to the bit line layer in the DRAM region as the shielding layer in the logic region, there is an advantageous effect that the resistor group and/or the signal interconnection layer in the logic region can be protected without providing a particular shielding layer.

Further, by using the layer common to the upper capacitor electrode layer in the DRAM region as the shielding layer in the logic region, there is an advantageous effect that the resistor group and/or the signal interconnection layer in the logic region can be protected without providing a particular shielding layer.

Further, by fixing the potential of the shielding layer, there is an advantageous effect that the resistor group and/or the signal interconnection layer can be prevented from exerting electrical influence upon other signal interconnections.

According to still another aspect of this invention, when a shielding layer is provided between the resistor group and the metal interconnection layer, the shielding layer is concurrently formed in both the DRAM region and the logic region. Therefore, there is an advantageous effect that the fabrication processes required for forming the shielding layer can be simplified.

According to still another aspect of this invention, when a shielding layer is provided on the upper layer and/or the lower layer of the signal interconnection layer, the shielding layer is concurrently formed in both the DRAM region and the logic region. Therefore, there is an advantageous effect that the fabrication processes required for forming the shielding layer can be simplified.

Further, by using the gate electrode layer as a shielding layer, the process of providing a particular shielding layer is not needed. Therefore, there is an advantageous effect that the fabrication processes required for forming the shielding layer can be more simplified.

Further, by using the bit line layer as a shielding layer, the process of providing a particular shielding layer is not needed. Therefore, there is an advantageous effect that the fabrication processes required for forming the shielding layer can be more simplified.

Further, by using the upper capacitor electrode layer 124 as a shielding layer, the process of providing a particular shielding layer is not needed. Therefore, there is an advantageous effect that the fabrication processes required for forming the shielding layer can be more simplified.

Further, by fixing the potential of the shielding layer, there is an advantageous effect that the resistor group and/or the signal interconnection layer can be prevented from exerting electrical influence upon other signal interconnections.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
    a semiconductor substrate having at least one DRAM region and one logic region;
    a resistor group including a plurality of resistors located in said logic region;
    a metal interconnection layer opposite said resistor grouping in said logic region; and
    a layer including a metal disposed between said resistor group and said metal interconnection layer in said logic region as a shielding layer and partially disposed within said DRAM region.

2. The semiconductor device according to claim 1, wherein said layer including a metal is a bit line layer in said DRAM region.

3. The semiconductor device according to claim 1, comprising a stacked capacitor in said DRAM region, said stacked capacitor including a lower capacitor electrode layer, a dielectric film, and an upper capacitor electrode layer, said upper capacitor electrode layer being part of said layer including a metal.

4. The semiconductor device according to claim 1, wherein said shielding layer has a fixed potential.

5. A semiconductor device comprising:
    a semiconductor substrate having at least one DRAM region and one logic region;
    a signal interconnection layer in said logic region;
    a metal interconnection layer in said logic region; and
    a first layer including a metal, located between said signal interconnection layer and said metal interconnection as a first shielding layer in said logic region, said first layer including a metal having a fixed potential.

6. The semiconductor device according to claim 5, wherein said signal interconnection layer is common to a gate electrode layer in said DRAM region.

7. The semiconductor device according to claim 5, wherein said signal interconnection layer is common to a bit line layer in said DRAM region.

8. The semiconductor device according to claim 5, comprising stacked capacitor in said DRAM region said stacked capacitor including a lower capacitor electrode layer, a dielectric film, and an upper capacitor electrode layer, said upper capacitor electrode layer in said DRAM region being part of said first layer including a metal.

9. A method of fabricating a semiconductor device having at least one DRAM region and one logic region and having a resistor group in said logic region, the method comprising:
    forming a resistor group in said logic region;
    forming a layer including a metal as a shielding layer in said logic region and in said DRAM region; and
    forming a metal interconnection layer opposite a portion of said logic region where said resistor group is located.

10. The method according to claim 9, wherein said layer including a metal is a bit line layer in said DRAM region.

11. The method according to claim 9, further comprising forming a stacked capacitor having a lower capacitor electrode layer, a dielectric film, and an upper capacitor electrode layer in said DRAM region, wherein said upper capacitor electrode layer is part of said layer including a metal.

12. The method according to claim 9, further comprising fixing potential of said shielding layer.

13. A method of fabricating a semiconductor device having at least one DRAM region and one logic region and having a signal interconnection layer in said logic region, the method comprising:
    forming a first layer including a metal as a first shielding layer in said logic region and in said DRAM region;
    forming a signal interconnection layer in said logic region opposite said first shielding layer; and
    forming a second layer including a metal as a second shielding layer opposite said signal interconnection layer in said logic region and in said DRAM region.

14. The method according to claim 13, wherein one of said first and second layers including a metal is a gate electrode layer in said DRAM region.

15. The method according to claim 13, further comprising forming a stacked capacitor having a lower capacitor electrode layer, a dielectric film, and an upper capacitor electrode layer in said DRAM region, wherein said upper capacitor electrode layer in said DRAM region is part of said second layer including a metal.

16. The method according to claim 13, further comprising fixing potential of one of said first and second shielding layers.

17. The semiconductor device according to claim 5, comprising a second layer including a metal, located between said signal interconnection layer and said semiconductor substrate, as a second shielding layer in said logic region.

18. The semiconductor device according to claim 17, wherein said second layer including a metal is common to a gate electrode layer in said DRAM region.

* * * * *